United States Patent
Graninger

(10) Patent No.: US 11,757,446 B2
(45) Date of Patent: Sep. 12, 2023

(54) SUPERCONDUCTING DC SWITCH SYSTEM

(71) Applicant: Aurelius L. Graninger, Sykesville, MD (US)

(72) Inventor: Aurelius L. Graninger, Sykesville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 232 days.

(21) Appl. No.: 17/375,199

(22) Filed: Jul. 14, 2021

(65) Prior Publication Data
US 2023/0128586 A1    Apr. 27, 2023

(51) Int. Cl.
*H03K 17/92*    (2006.01)
*H10N 60/12*    (2023.01)

(52) U.S. Cl.
CPC ............ *H03K 17/92* (2013.01); *H10N 60/12* (2023.02)

(58) Field of Classification Search
CPC ...... H03K 17/92; H03K 17/005; H03K 17/10; H03K 17/12
See application file for complete search history.

(56) References Cited

U.S. PATENT DOCUMENTS

| | | | |
|---|---|---|---|
| 3,643,237 A | 2/1972 | Anacker | |
| 6,331,805 B1 * | 12/2001 | Gupta | H03B 15/00 331/107 S |
| 9,520,180 B1 * | 12/2016 | Mukhanov | A61Q 19/08 |
| 2001/0025012 A1 * | 9/2001 | Tarutani | H03F 19/00 505/100 |
| 2010/0033206 A1 * | 2/2010 | Herr | H03K 19/1952 327/528 |
| 2018/0254693 A1 * | 9/2018 | Serghine | H02K 44/08 |

FOREIGN PATENT DOCUMENTS

| | | | |
|---|---|---|---|
| JP | S58 66419 A | 4/1983 | |
| JP | H01 99479 | * 4/1989 | ............ H03K 17/92 |
| JP | H01 99479 A | 4/1989 | |
| JP | 2002299704 | 10/2002 | |

OTHER PUBLICATIONS

Naaman, et al.: "On-Chip Josephson Junction Microwave Switch"; Appl. Phys. Lett. 108, 112601 (2016); https://doi.org/10.1063/1.4943602; Submitted: Dec. 7, 2015. Accepted: Jan. 21, 2016. Published Online: Mar. 14, 2016.

Borodulin, et al.: "Operation of a Latching, Low-Loss, Wideband Microwave Phase-Change Switch Below 1 K"; Journal of Low Temperature Physics (2019) 194:273-284; https://doi.org/10.1007/s10909-018-2096-8.

Extended European Search Report (EESR) for corresponding EP 22180341.4, dated Nov. 18, 2022.

* cited by examiner

*Primary Examiner* — Sibin Chen
(74) *Attorney, Agent, or Firm* — Tarolli, Sundheim, Covell & Tummino LLP

(57) ABSTRACT

A superconducting DC switch system is provided. The superconducting DC switch system comprises one or more Josephson junctions (JJs), and a magnetic field generator that is configured to switch from inducing a magnetic field in a plane of the one or more JJs, and providing no magnetic field in the plane of the one or more JJs. A DC input signal applied at an input of the one or more JJs is passed through to an output the one or more JJs in the absence of an induced magnetic field, and the DC input signal is substantially suppressed at the output of the one or more JJs in the presence of the magnetic field.

16 Claims, 4 Drawing Sheets

SUPERCONDUCTING DC SWITCH SYSTEM

GOVERNMENT INTEREST

The invention was made under Government Contract. Therefore, the US Government has rights to the invention as specified in that contract.

TECHNICAL FIELD

The present invention relates generally to superconducting circuits, and more particularly to a superconducting DC switch system.

BACKGROUND

Conventional microwave mechanical, electro-mechanical, and electronic switches may not be compatible with on-chip integration and cryogenic operation of superconducting electronic circuits, because of incompatible fabrication processes and high power dissipation. Likewise, tunable filters that are commonly realized by use of either active components such as voltage-variable capacitors i.e. varactors, mechanical drivers, or ferroelectric and ferrite materials, are not easily controllable by signal levels that can be generated with single flux quantum (SFQ) or other superconducting circuit technologies, and many are not operable at cryogenic temperatures. While superconducting microwave filters, both fixed and tunable, have been previously realized using both high temperature and low temperature superconductors, their use in switching applications suffered from high return loss, limited usable bandwidth, and poor out-of-band off-state isolation.

There are a number of different approaches to solve the routing of DC current biases on superconducting integrated circuits. One approach is to mount external switches somewhere on the cryogenic apparatus, such as a large electro-mechanical switch. The approach of implementing electro-mechanical relays into the cryogenic apparatus has several drawbacks including a loss of physical space in the apparatus, and the fact that the switches generate excessive heat that can disrupt the base temperature of the apparatus.

SUMMARY

In one example, a superconducting DC switch system is provided. The superconducting DC switch system comprises one or more Josephson junctions (JJs), and a magnetic field generator that is configured to switch from inducing a magnetic field in a plane of the one or more JJs, and providing no magnetic field in the plane of the one or more JJs. A DC input signal applied at an input of the one or more JJs is passed through to an output of one or more of the one or more JJs in the absence of an induced magnetic field, and the DC input signal is substantially suppressed at the output of the one or more JJs in the presence of the magnetic field.

In yet another example, a superconducting DC switch system is provided that comprises a switch network comprising a plurality of Josephson junction (JJ) switches, and a magnetic field generator that is configured to switch from inducing a magnetic field in a plane of the one or more JJ switches, and providing no magnetic field in the plane of the one or more JJ switches. A DC input signal applied at an input of the one or more JJ switches is passed through to an output of the one or more JJ switches in the absence of an induced magnetic field, and the DC input signal is substantially suppressed at the output of the one or more JJ switches in the presence of the magnetic field. A switch controller is configured to control the switching of the magnetic field generator between an induction state and an off state.

DETAILED DESCRIPTION

The present disclosure relates generally to superconducting circuits, and more particularly to a superconducting DC switch system. In one example, the superconducting DC switch system includes a superconducting switch network configuration (e.g., a single-pole-multi-throw switch) that can route a direct current (DC) signal to any one of N superconducting loads on a superconducting integrated circuit. In another example, a superconducting switch network configuration can provide a predetermined DC current in the on state to a single load, and a predetermined off resistance in the off state. The switch network configuration can include a plurality of superconducting switches. Each superconducting switch is superconducting in the on state and has a finite resistance in the off state, which results in an on/off ratio that is virtually infinite.

In one example, the switch is formed from a Josephson junction (JJ) that can be switched between a finite resistance state by substantially suppressing the critical current of the JJ in the presence of an induced magnetic field, and a zero DC resistance state in absence of the induced magnetic field. In this context, substantial suppression of the DC input signal refers to the impact on the DC input signal resulting from the one or more JJs going from a zero-resistance to a finite-resistance state in the presence of the magnetic field, which could in one example significantly reduce the current flowing from the input to the output to a negligible amount. The JJ can be a stand-alone component or placed in parallel with a resistor. The superconducting DC switch system can also include a magnetic field generator that can be controlled to provide the induced magnetic field or turned off to remove the induced magnetic field.

In one example, the superconducting DC switch system provides an on-chip switching device to facilitate the routing of DC biases on superconducting integrated circuits. In a variety of superconducting electronics applications, it is necessary to apply a superconducting DC bias current to a particular circuit element, and in some cases it may be desirable to choose which element this bias current flows through. Often times this selectivity is achieved by incorporating a switch matrix into the cryogenic apparatus or by using an individual current source for each circuit element. By implementing the DC switch system, the need is eliminated for an external switch matrix and/or multiple DC bias sources by providing an on-chip switching element that can route a single DC bias to any one of a number of desired loads. In one example, the switch is a JJ enclosed by an isolated on-chip solenoid, or otherwise coupled to a suitable bias line, that when current-biased will generate a localized magnetic field oriented in the plane of the JJ.

Figure 1:
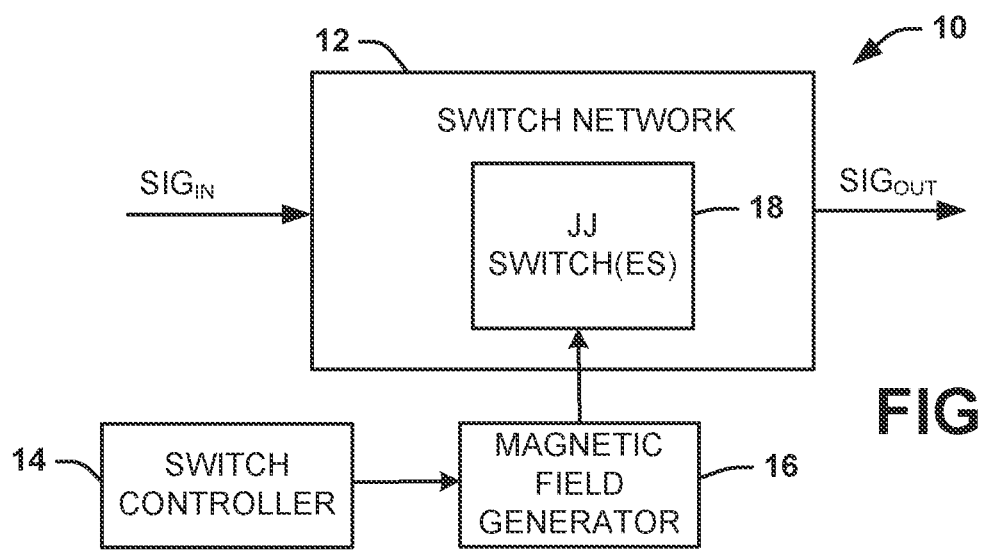
FIG. 1 illustrates a schematic block diagram of a superconducting DC switch system.

FIG. 1 illustrates a schematic block diagram of a superconducting DC switch system 10. The superconducting DC switch system 10 includes a switch network configuration 12 of one or more JJ switches 18. Each JJ switch is formed from a single Josephson junction. The one or more JJ switches 18 can be grouped together in parallel to provide the maximum on-state current without the need to increase the size of the JJs. A switch controller 14 controls the absence or presence of a magnetic field induced by a magnetic field generator 16. The magnetic field generator 16 can be a solenoid or a suitable bias line. Each of the one or more JJ switches can be switched between a finite resistance state and a zero DC resistance state based on the presence and absence of the induced magnetic field by the magnetic field generator 16. In the zero DC resistance state, a DC signal (SIGN) passes through the switch network configuration 12 via the one or more JJ switches 18 to an output ($SIG_{OUT}$) of the switch network configuration 12 without suppression. In the finite resistance state, the DC signal (SIGN) is substantially suppressed at the output ($SIG_{OUT}$) of the switch network configuration 12 since the critical current of the JJs within the one or more JJ switches are suppressed.

Figure 2:
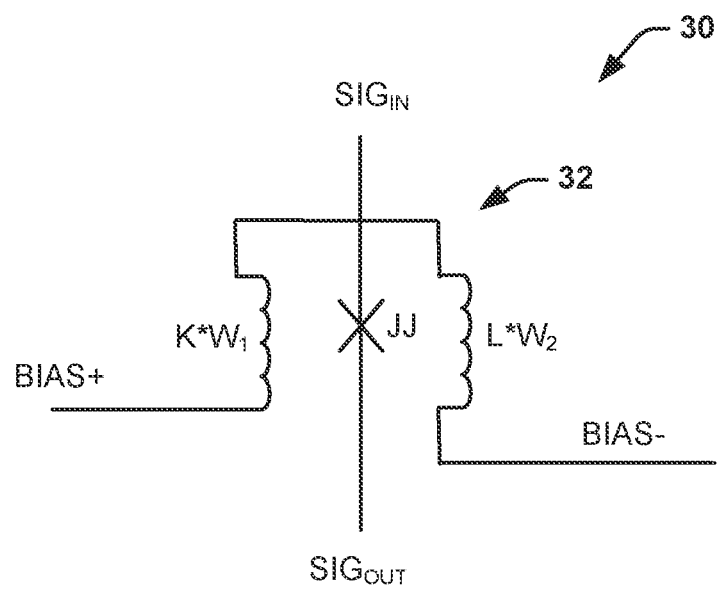
FIG. 2 illustrates a schematic diagram of an example of a DC switch system formed from a single JJ that is a controlled by a solenoid that acts as a magnetic field generator to induce a magnetic field.

FIG. 2 illustrates a schematic diagram of an example of a DC switch system 30 formed from a single JJ that is a controlled by a solenoid 32 that acts as a magnetic field generator to induce a magnetic field. The solenoid 32 is represented schematically by one or more first windings designated as $K*W_1$, where K is the number of first windings $W_1$ and K is an integer greater than or equal to one. The solenoid 32 also includes one or more second windings designated as $L*W_2$, where L is the number of second windings $W_2$ and L is an integer greater than or equal to one. In an integrated circuit structure, each of the first and second windings would span a top and bottom layer, and the JJ would be in an intermediate layer. The solenoid would be formed with a repetition of ends of first windings connecting with ends of second windings in a loop winding configuration that substantially surrounds the JJ.

A bias current, applied through BIAS+ input terminal and exiting the BIAS-output terminal, runs through the loop winding generating a magnetic field oriented in the plane of the JJ and suppresses the critical current of the JJ, which in turn substantially suppresses a DC current that is provided at an input SIGN of the JJ from flowing at the output $SIG_{OUT}$ of the JJ. With no bias current running through the loop winding, the JJ superconducts and provides the DC current provided at the input SIGN to the output $SIG_{OUT}$ without suppression.

In one example, there is a particular magnitude of generated magnetic field that will completely suppress the critical current of the JJ to zero. With no solenoid current bias, the JJ is superconducting and has zero DC resistance. With an appropriate solenoid bias, the Josephson junction is not superconducting and has a finite DC resistance. The DC resistance is given either by the intrinsic sub-gap resistance of the JJ, or by a shunt resistance (not shown) that may be included in parallel with the JJ. Without loss of generality, either one of these resistances can be referred to as Rshunt. Accordingly, a current-tunable switching element can be provided with an on-state resistance of zero and an off-state resistance given by Rshunt, designed and fabricated in a superconducting integrated process that includes a Josephson junction, a resistive wiring layer, superconducting wiring layers above and/or below the junction, and superconducting interconnects.

An important design consideration for the superconducting switch is the maximum current that the Josephson junction can sustain in the on-state, which for a single Josephson switching element is given by the critical current $I_C$. The maximum signal current that can be sustained in the on-state can be increased by placing multiple switching elements in parallel as opposed to making larger JJs to increase the critical current, as is schematically illustrated in FIG. 3.

Figure 3:
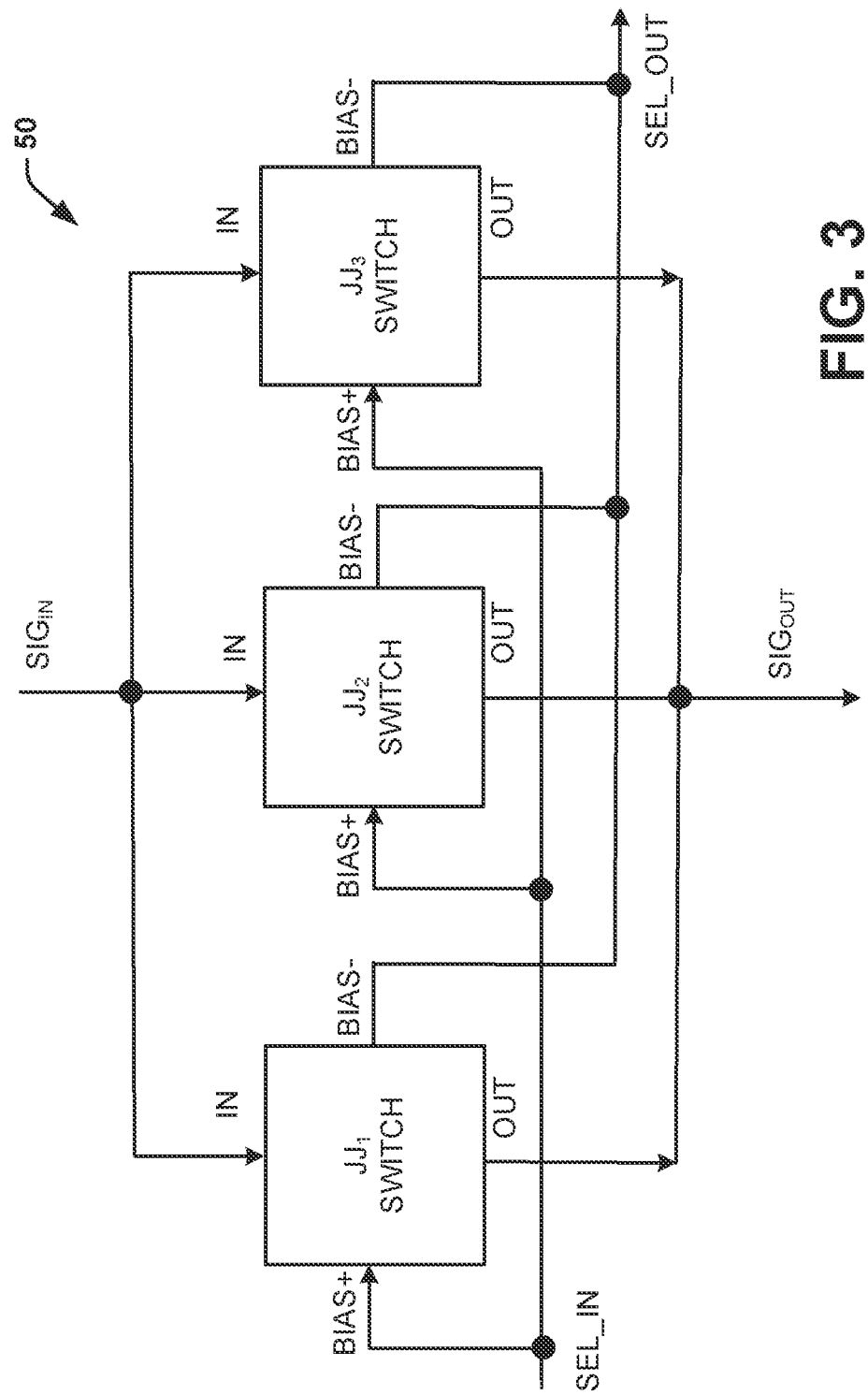
FIG. 3 illustrates an example switch network configuration where multiple instances of the Josephson switching elements are placed in parallel, so as to increase the maximum current in the on-state.

FIG. 3 illustrates an example switch network configuration 50 where multiple instances of the Josephson switching elements are placed in parallel, so as to increase the maximum current in the on-state. In this example, the switch network configuration 50 includes a first current-tunable switch $JJ_1$, a second current-tunable switch $JJ_2$, and a third current-tunable switch $JJ_3$. The current-tunable switches $JJ_1$, $JJ_2$ and $JJ_3$ are wired such that the current from DC signal SIGN divides through the three switches to each respective input terminal (IN), while the bias lines for the three switches are chained together in parallel (BIAS+, BIAS−), so that they can be simultaneously switched on or off by applying appropriate current from a positive bias line SEL_IN to a negative bias line SEL_OUT for each respective switch.

During the on-state, a DC current flows through the current-tunable switches $JJ_1$, $JJ_2$ and $JJ_3$ with no resistance, with a maximum DC current that can be applied from SIGN to $SIG_{OUT}$ that is given by the combined critical currents of $JJ_1$, $JJ_2$ and $JJ_3$. In this particular case, the maximum on-state current is given by $3*I_C$, where $I_C$ is the critical current of a single JJ with all JJs having substantially the same critical currents, and in a case of N general elements, where N is an integer greater than 2, designed in parallel provides a maximum on-state current of $N*I_C$. The off-state resistance in this particular case is Rshunt/3 and in the general case is Rshunt/N. During the off-state, a DC current applied at SIGN is substantially suppressed at $SIG_{OUT}$ since the critical currents of each of current-tunable switches $JJ_1$, $JJ_2$ and $JJ_3$ is suppressed and result in a resistance that causes the DC current at $SIG_{OUT}$ to be negligible.

Figure 4:
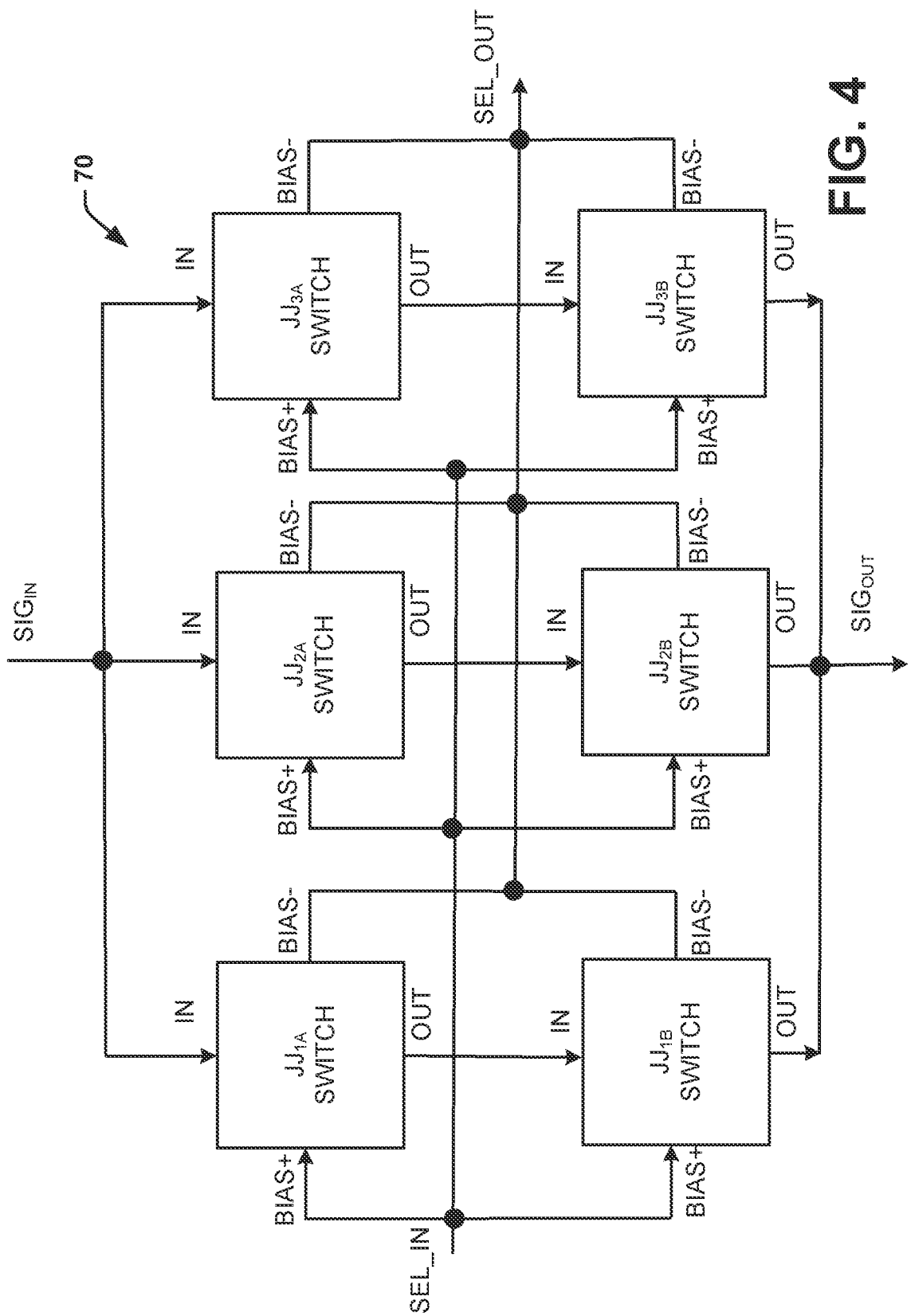
FIG. 4 is a schematic illustration of an example of a superconducting switch network configuration where Josephson junction switching elements are arranged in both a parallel and serial fashion.

A switch network configuration may be further modified to tune the off-state resistance by placing multiple switching elements in series. Therefore, a switch network configuration can include both parallel and series switches to provide both an increase in on-state current and an increase in off-state resistance. FIG. 4 is a schematic illustration of an example of a superconducting switch network configuration 70 where Josephson junction switching elements are arranged in both a parallel and serial fashion. The superconducting switch network configuration 70 includes a first parallel set of JJ switching elements including a first current-tunable switch $JJ_{1A}$, a second current-tunable switch $JJ_{2A}$, and a third current-tunable switch $JJ_{3A}$, and a second parallel set of JJ switching elements including a fourth current-tunable switch $JJ_{1B}$, a fifth current-tunable switch $JJ_{2B}$, and a sixth current-tunable switch $JJ_{3B}$. A respective JJ current-tunable switch from the first parallel set is arranged in series with a respective JJ current-tunable switch from the second parallel set, such that the fourth current-tunable switch $JJ_{1B}$ is in series with the first current-tunable switch $JJ_{1A}$, the fifth current-tunable switch $JJ_{2B}$ is in series with the second current-tunable switch $JJ_{2A}$, and the sixth current-tunable switch $JJ_{3B}$ is in series with the $3^{rd}$ current-tunable switch $JJ_{3A}$.

The current-tunable switches $JJ_{1A}$, $JJ_{2A}$, $JJ_{3A}$, $JJ_{1B}$, $JJ_{2B}$, and $JJ_{3B}$ are wired such that the current from DC signal SIGN divides through the first parallel set of switches to each respective input terminal with each output terminal coupling to respective input terminals of respective current-tunable switches of the second parallel set of switches. The bias lines for the six switches are chained together in parallel, so that they can be simultaneously switched on or off by applying appropriate current from a positive bias line SEL_IN to a negative bias line SEL_OUT for each respective switch to selectively provide the DC signal SIGN as a DC $SIG_{OUT}$. The switch network configuration 70 increases the maximum current in the on-state, while also increasing the off-state resistance.

The maximum on-state current for this particular switch is given by $3*I_C$, where $I_C$ is the critical current of a single JJ with all JJs having substantially the same critical currents, and the maximum off-state resistance for this particular switch is given by 2*Rshunt/3, where 2 is the number of switches in series of the parallel sets, doubling the off-state resistance relative to the off-state resistance from the example of FIG. 3. In the general case, where the switch network configuration is comprised of N parallel combinations of M series switching elements, the maximum on-state current and the off-state resistance is given by $N_P*I_C$ and $M_S*Rshunt/N_P$, respectively where $M_S$ and $N_P$ are integers greater than one that may or may not be equal to one another.

Figure 5:
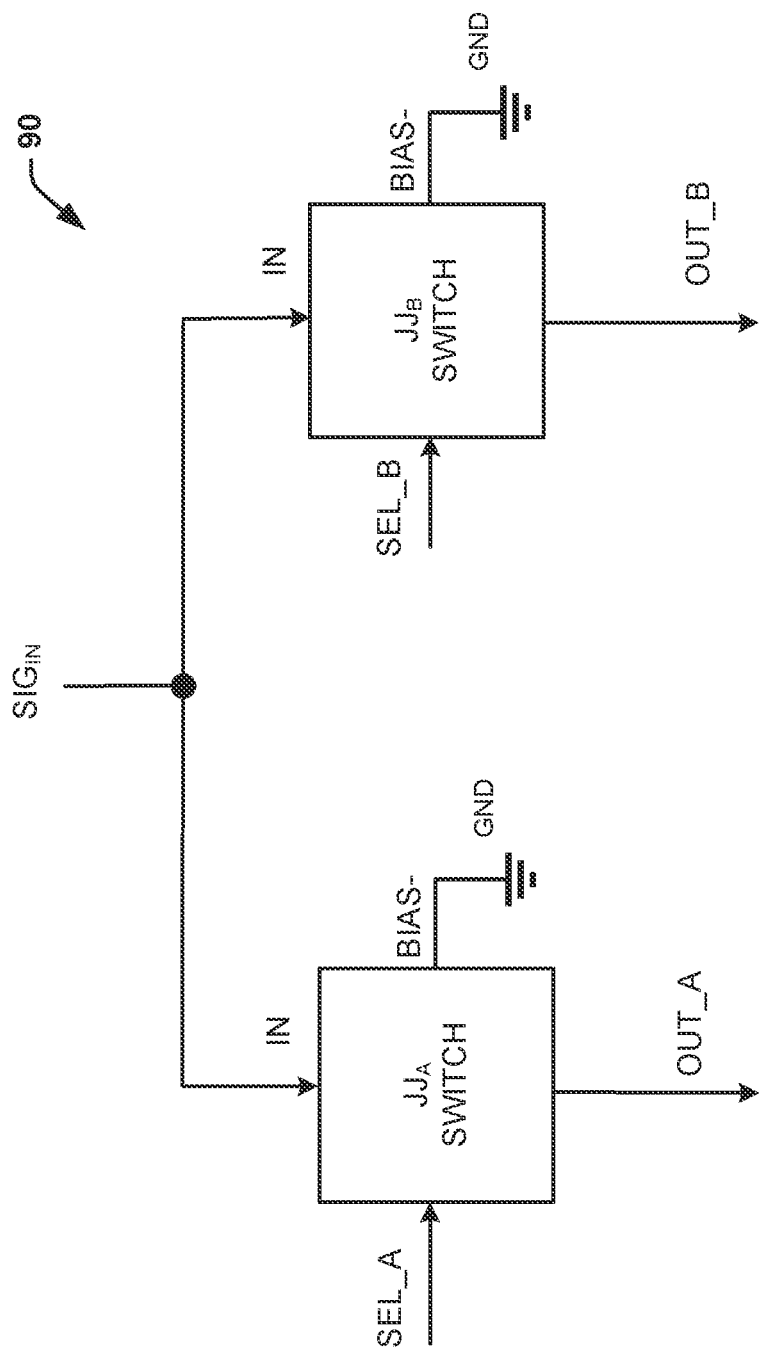
FIG. 5 illustrates an example schematic for a single-pole-double-throw (SPDT) switch network configuration.

The switch network configurations described thus far can be used to design a single-pole-multi-throw switch that is able to route a DC signal to a desired superconducting load, with a maximum on-state current and an off-state resistance that can both be arbitrarily chosen by the designer. FIG. 5 illustrates an example schematic for a single-pole-double-throw (SPDT) switch network configuration 90. A DC input signal SIGN goes through a switch network configuration with two switching elements whose effective resistances are tuned by individual select lines. The switch network configuration 90 includes a first current-tunable switch $JJ_A$, and a second current-tunable switch $JJ_B$. A first select line SEL_A is coupled to a select port of the first current-tunable switch $JJ_A$, and a second select line SEL_B is coupled to a select port of the second current-tunable switch $JJ_B$. Applying current to one select line will short the signal current through the other switching element. The DC input signal SIGN is coupled to the input terminals (IN) of both the first current-tunable switch $JJ_A$ and the second current-tunable switch $JJ_B$ to be routed to either output port OUT_A of the first current-tunable switch $JJ_A$ or output port OUT_B of the second current-tunable switch $JJ_B$. When an appropriate current bias is applied to SEL_A, switch $JJ_A$ is turned off and the signal will be routed to output port OUT_B; and conversely, when an appropriate current bias is applied to SEL_B, switch $JJ_A$ is turned off and the signal will be routed to output port OUT_A. This SPDT switch can be easily expanded to the general case of a SPNT switch.

It is to be appreciated that FIGS. 3-5 are example switch network configurations, and a number of different configurations can be derived from employing a number of JJ switches in different arrangements. Additionally, each JJ switch could be replaced with a switch network configuration, such that the various switch network configurations can be employed as building blocks for bigger switch network configurations. For example, each JJ switch in FIGS. 3-5 can be replaced with an entire switch network configuration of any of FIGS. 3-5 for increasing on-state current outputs, increasing off-state resistance, providing selectability between outputs, or a combination of any of these desired traits.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting DC switch system comprising:
   a plurality of Josephson junctions (JJs) configured as a first set of parallel JJs and a second set of parallel JJs, each JJ of the first set of parallel JJs being coupled in series with a respective JJ of the second set of parallel JJs; and
   a magnetic field generator that is configured to switch from inducing a magnetic field in a plane of the JJs, and providing no magnetic field in the plane of the JJs, wherein a DC input signal applied at an input of the JJs is passed through to an output of the JJs in the absence of an induced magnetic field at a maximum combined DC current based on a combination of critical currents of either the first set of parallel JJs or the second set of parallel JJs, and the DC input signal is substantially suppressed at the output of the JJs in the presence of the magnetic field based on an off-state resistance corresponding to the number of parallel sets of JJs.

2. The system of claim 1, wherein each of the JJs have a zero DC resistance in the absence of an induced magnetic field, and have a finite resistance in the presence of the induced magnetic field.

3. The system of claim 2, wherein the induced magnetic field is selected to suppress the critical current of the JJs to substantially zero.

4. The system of claim 1, wherein each of the JJs are in parallel with respective resistors.

5. The system of claim 1, wherein the JJs comprises a first JJ having a first select line and a second JJ having a second select line, wherein applying a bias signal to the first select line will provide the DC input signal to an output of the second JJ and applying a bias signal to the second select line will provide the DC input signal to the output of the first JJ.

6. The system of claim 1, wherein the magnetic field generator is a solenoid with a loop winding that surrounds the JJs.

7. The system of claim 1, wherein the magnetic field generator is a bias line that can be configured in such a way as to induce a magnetic field through the JJs when a current bias is applied.

8. The system of claim 1, further comprising a switch controller configured to control the switching of the magnetic field generator between an on state and an off state.

9. A superconducting DC switch system comprising:
   a switch network comprising a plurality of Josephson junction (JJ) switches configured as a first set of parallel JJ switches and a second set of parallel JJ switches, each JJ of the first set of parallel JJ switches being coupled in series with a respective JJ of the second set of parallel JJ switches;
   a magnetic field generator that is configured to switch from inducing a magnetic field in a plane of the JJ switches, and providing no magnetic field in the plane of the JJ switches, wherein a DC input signal applied at an input of the JJ switches is passed through to an output of the JJ switches in the absence of an induced magnetic field at a maximum combined DC current based on a combination of critical currents of either the first set of parallel JJ switches or the second set of parallel JJ switches, and the DC input signal is substantially suppressed at the output of the JJ switches in the presence of the magnetic field based on an off-state resistance corresponding to the number of parallel sets of JJ switches; and a switch controller configured to control the switching of the magnetic field generator between an on state and an off state.

10. The system of claim 9, wherein each of the JJ switches have a zero DC resistance in the absence of an induced magnetic field, and have a finite resistance in the presence of the induced magnetic field.

11. The system of claim 10, wherein each of the JJ switches comprises a single JJ.

12. The system of claim 11, wherein the induced magnetic field is selected to substantially suppress the critical current of the single JJ in one or more of the JJ switches to substantially zero.

13. The system of claim 9, wherein each of the JJ switches are in parallel with respective resistors.

14. The system of claim 9, wherein the JJ switches comprises a first JJ switch having a first select line and a second JJ switch having a second select line, wherein applying a bias signal to the first select line will provide the DC input signal to an output of the second JJ switch and applying a bias signal to the second select line will provide the DC input signal to the output of the first JJ switch.

15. The system of claim 9, wherein the magnetic field generator is a solenoid with a loop winding that surrounds the JJ switches.

16. The system of claim 9, wherein the magnetic field generator is a bias line that can be configured in such a way as to induce a magnetic field through the JJ switches when a current bias is applied.

* * * * *